(12) United States Patent
Groepl et al.

(10) Patent No.: US 10,324,201 B2
(45) Date of Patent: Jun. 18, 2019

(54) DIGITAL-ANALOGUE CONVERTER FOR MULTI-THRESHOLD COUNTERS WITH PARTITIONING OF THE BITS BETWEEN RESISTOR LADDER AND COMPARATOR

(71) Applicant: Siemens Healthcare GmbH, Erlangen (DE)

(72) Inventors: Martin Groepl, Sonthofen (DE); Edgar Goederer, Forchheim (DE); Thomas Suttorp, Munich (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 411 days.

(21) Appl. No.: 15/263,522

(22) Filed: Sep. 13, 2016

(65) Prior Publication Data

US 2017/0090048 A1 Mar. 30, 2017

(30) Foreign Application Priority Data

Sep. 28, 2015 (DE) .................. 10 2015 218 581

(51) Int. Cl.
*G01R 1/24* (2006.01)
*H03M 1/66* (2006.01)
(Continued)

(52) U.S. Cl.
CPC ............ *G01T 1/247* (2013.01); *H03M 1/662* (2013.01); *H03M 1/68* (2013.01); *H03M 1/785* (2013.01); *H03M 1/808* (2013.01)

(58) Field of Classification Search
CPC ......... G01T 1/247; H03M 1/662; H03M 1/68; H03M 1/785; H03M 1/808; H03K 3/00; H05G 1/64
(Continued)

(56) References Cited

U.S. PATENT DOCUMENTS

| 5,801,655 A | 9/1998 | Imamura |
| 5,940,020 A | 8/1999 | Ho |
| (Continued) |

FOREIGN PATENT DOCUMENTS

| CN | 101420229 A | 4/2009 |
| CN | 102365562 A | 2/2012 |
| (Continued) |

OTHER PUBLICATIONS

German Office Action dated Jun. 28, 2016.
(Continued)

*Primary Examiner* — David P Porta
*Assistant Examiner* — Meenakshi S Sahu
(74) *Attorney, Agent, or Firm* — Harness, Dickey & Pierce, P.L.C.

(57) ABSTRACT

An X-ray detector includes an N-channel digital-analogue converter controllable with K+L bits. In an embodiment, the digital-analogue converter includes a first voltage source to provide a plurality of first voltage values at tapping points; and a switch unit with N switch matrices, $2^K$ inputs of the switch matrices being electrically conductively connected to $2^K$ tapping points of the first voltage source. The digital-analogue converter also includes a second voltage source including N subunits. The X-ray detector further includes a discriminator unit including N comparators, at least one input of the comparators being electrically conductively connected to the associated output of the switch matrix and/or to the associated output of the subunit, so that the associated first voltage value and the associated second voltage value are associable with each comparator. A signal of an output of a pre-amplifier, and the associated first and second voltage values are comparable in the comparator.

21 Claims, 10 Drawing Sheets

(51) Int. Cl.
    *H03M 1/68*     (2006.01)
    *H03M 1/78*     (2006.01)
    *H03M 1/80*     (2006.01)
    *G01T 1/24*     (2006.01)

(58) Field of Classification Search
    USPC .................................................. 250/370.09
    See application file for complete search history.

(56) References Cited

U.S. PATENT DOCUMENTS

| | | |
|---|---|---|
| 7,015,847 B1 | 3/2006 | McLachlan |
| 9,945,964 B2 * | 4/2018 | Goderer .................. G01T 1/247 |
| 2005/0139757 A1 | 6/2005 | Iwanczyk |
| 2005/0195098 A1 | 9/2005 | Panov |
| 2008/0224909 A1 | 9/2008 | Itoh |
| 2012/0001078 A1 | 1/2012 | McEvoy et al. |
| 2012/0274488 A1 | 11/2012 | Kapusta |
| 2014/0016748 A1 * | 1/2014 | Spahn ..................... G01T 1/247 |
| | | 378/62 |
| 2014/0185781 A1 | 7/2014 | Reitz |

FOREIGN PATENT DOCUMENTS

| | | |
|---|---|---|
| CN | 103518329 A | 1/2014 |
| DE | 102004002013 A1 | 8/2005 |
| DE | 102012212124 A1 | 1/2014 |

OTHER PUBLICATIONS

German Office Action dated Apr. 1. 2019.
Chinese Office Action and English translation thereof dated Mar. 13, 2019.

* cited by examiner

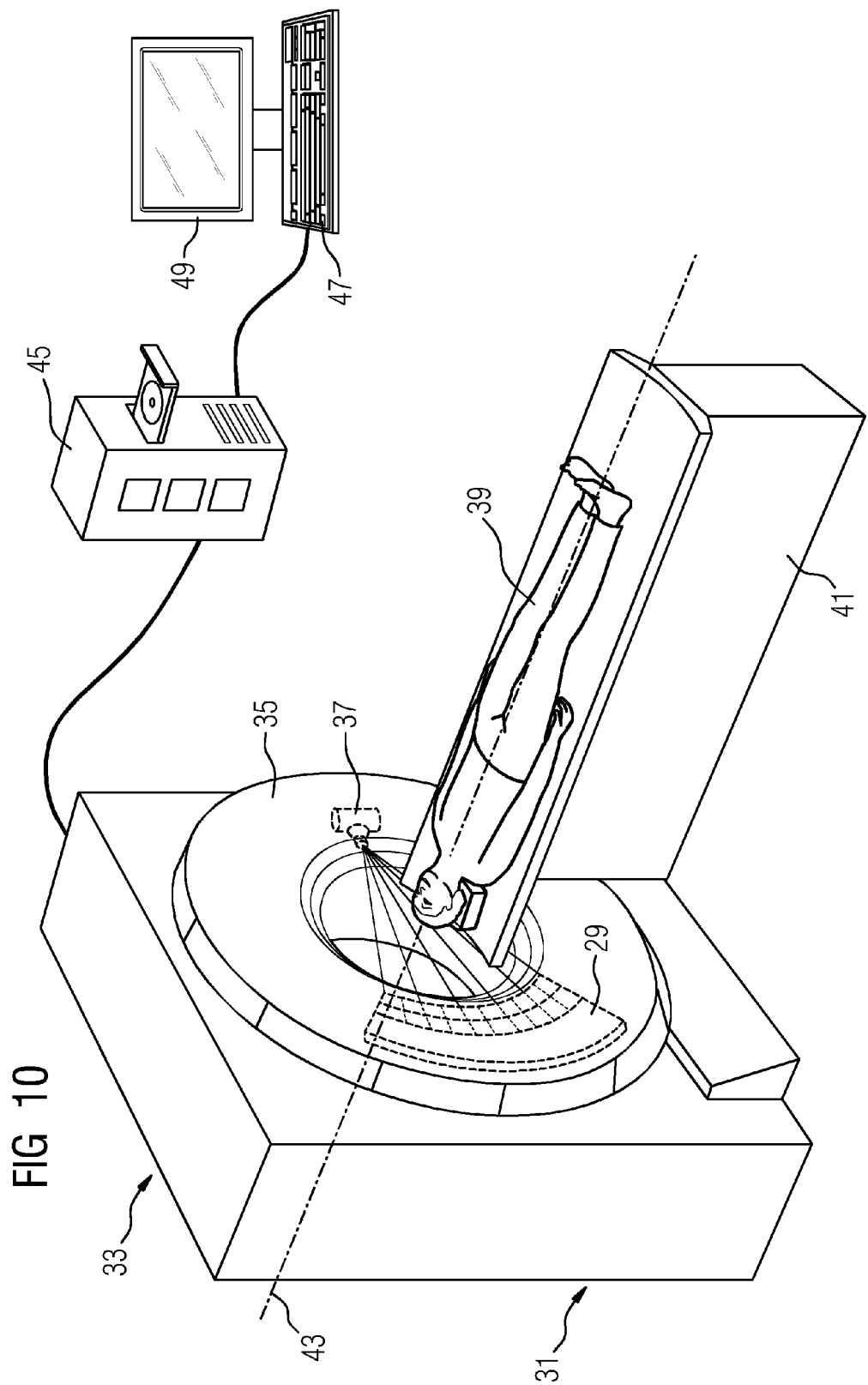

DIGITAL-ANALOGUE CONVERTER FOR MULTI-THRESHOLD COUNTERS WITH PARTITIONING OF THE BITS BETWEEN RESISTOR LADDER AND COMPARATOR

PRIORITY STATEMENT

The present application hereby claims priority under 35 U.S.C. § 119 to German patent application number DE 102015218581.8 filed Sep. 28, 2015, the entire contents of which are hereby incorporated herein by reference.

FIELD

At least one embodiment of the invention relates to an X-ray detector comprising an N-channel controllable digital-analogue converter and a medical device.

BACKGROUND

In the field of X-ray imaging, for example, in computed tomography, angiography or radiography, counting direct-conversion X-ray detectors can be used. The X-ray radiation or the photons can be converted into electrical pulses via a suitable sensor. CdTe, CZT, CdZnTeSe, CdTeSe, CdMnTe, InP, TlBr$_2$, HgI$_2$, GaAs, for example, or others can be used as the sensor material. The electric pulses are evaluated by an evaluating electronic system, for example an integrated circuit (Application Specific Integrated Circuit, ASIC).

In counting X-ray detectors, incident X-ray radiation is measured by counting the electric pulses which are triggered by the absorption of X-ray photons in the detector material. The size of the electric pulses is typically proportional to the energy of the absorbed X-ray photon. By this, spectral information can be extracted by comparison of the size of the electric pulse with a threshold value. Only those electric pulses which exceed the threshold are counted as an event. A photon-counting detector element, for example, a subpixel or a macropixel formed from a plurality of subpixels grouped together can have a plurality of threshold values and a register associated with the threshold values. The threshold values can be associated with different photon energies. The incident spectrum can thus be scanned in a plurality of energy intervals. X-ray recordings with spectral information can thus be provided.

The characteristic absorption spectrum or the different absorption behavior of different materials can be used for material differentiation. This can typically be used in the reconstruction of computed tomography recordings with a plurality of base materials, for example, water, iodine, bone, gadolinium or gold. The differentiation of a plurality of base materials requires an equivalent number of independent measurements. The measurements can be carried out with different energy channels or threshold values. Thus, a plurality of threshold values or energy channels are needed in order to be able to differentiate the materials within the examination object. Apart therefrom, independent measurements can also enable a weighted addition of the counting events in different energy channels, which enables an improved contrast for monochromatic X-ray images. Counting X-ray detectors can therefore advantageously be suitable, in particular, for recording slice images, for example, with a computed tomography device or a C-arm angiography system.

Known implementations of a plurality of energy channels realize a smallest possible implementation of the digital-analogue converter within a detector element, for example, with a current-controlled digital-analogue converter (current steering DAC), an R2R network, a segmented digital-analogue converter or a digital-analogue converter with pulse width modulation (PWM) and a low pass filter. Alternatively, digital-analogue converters can be used which are usable globally for the whole matrix of detector elements, wherein one digital-analogue converter is used per energy channel. In addition to the supply of a voltage from the global digital-analogue converter, each detector element has an additional smaller digital-analogue converter, wherein this smaller digital-analogue converter enables a fine setting of the threshold value. The known implementations have a direct proportional relationship between the number of energy channels and the area of the digital-analogue converter and the power consumption of the digital-analogue converter.

A plurality of, or additional, energy channels are associated with an increased space requirement, an increased power consumption and a higher required bandwidth for readout. The energy thresholds require a settable reference voltage for the threshold value, a comparator and a register. The increased space requirement limits the size of the detector elements. The size of the detector elements must be adapted to the space requirement of the energy channels. The smaller the size of the detector elements, the better the spatial resolution of the medical device can be.

SUMMARY

Embodiments of the invention include an X-ray detector and a medical device which enable a plurality of energy channels in a space-saving and energy-efficient implementation within a detector element. In at least one embodiment, the inventors propose a novel implementation of a digital-analogue converter with which the threshold values can be adjusted so that a plurality of threshold values or energy channels can be provided within one detector element and the problem of the increased space requirement and of the increased power requirement can thereby be reduced.

At least one embodiment of the invention is directed to an X-ray detector and/or a medical device.

At least one embodiment of the invention relates to an X-ray detector comprising an N-channel digital-analogue converter controllable with K+L bits and having a first voltage source which provides a plurality of first voltage values at tapping points and wherein the first voltage values are equidistant and providable in a monotonic sequence. The digital-analogue converter also comprises a switch unit with N switch matrices, wherein 2K inputs of the switch matrices are electrically conductively connected to 2K tapping points of monotonically sequential first voltage values of the first voltage source, wherein a tapping point of the first voltage source of the switch matrices is selectable with K bits and wherein the switch matrices have a selected first voltage value at an output. The digital-analogue converter also comprises a second voltage source wherein the second voltage source comprises N subunits and wherein a second voltage value is selectable with L bits. The X-ray detector also comprises a discriminator unit wherein the discriminator unit comprises N comparators and wherein at least one input of the comparators is electrically conductively connected to the associated output of the switch matrix and/or to the associated output of the subunit, so that the associated first voltage value and the associated second voltage value are associable with each comparator. A signal of an output of a pre-amplifier, the associated first voltage value and the associated second voltage value are comparable in the comparator.

At least one embodiment of the invention further relates to a medical device comprising at least one embodiment of an X-ray detector.

BRIEF DESCRIPTION OF THE DRAWINGS

Example embodiments of the invention will now be described in more detail, making reference to the drawings. In the drawings:

FIG. 10 is a schematic representation of a computed tomography device according to an embodiment of the invention.

DETAILED DESCRIPTION OF THE EXAMPLE EMBODIMENTS

Figure 1:
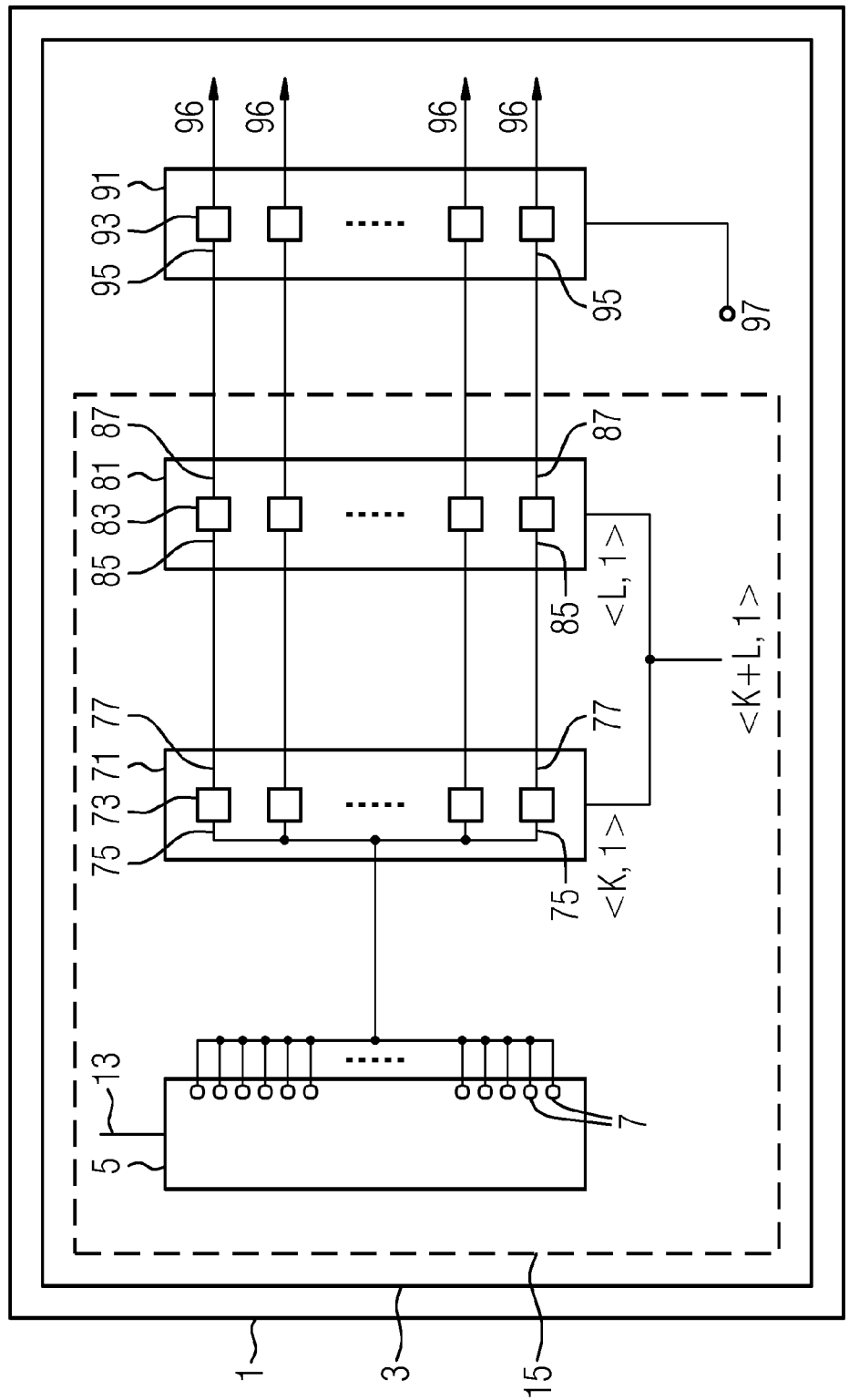
FIG. 1 is a schematic representation of a concept of an X-ray detector according to the invention in accordance with a first embodiment.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention relates to an X-ray detector comprising an N-channel digital-analogue converter controllable with K+L bits and having a first voltage source which provides a plurality of first voltage values at tapping points and wherein the first voltage values are equidistant and providable in a monotonic sequence. The digital-analogue converter also comprises a switch unit with N switch matrices, wherein 2K inputs of the switch matrices are electrically conductively connected to 2K tapping points of monotonically sequential first voltage values of the first voltage source, wherein a tapping point of the first voltage source of the switch matrices is selectable with K bits and wherein the switch matrices have a selected first voltage value at an output. The digital-analogue converter also comprises a second voltage source wherein the second voltage source comprises N subunits and wherein a second voltage value is selectable with L bits. The X-ray detector also comprises a discriminator unit wherein the discriminator unit comprises N comparators and wherein at least one input of the comparators is electrically conductively connected to the associated output of the switch matrix and/or to the associated output of the subunit, so that the associated first voltage value and the associated second voltage value are associable with each comparator. A signal of an output of a pre-amplifier, the associated first voltage value and the associated second voltage value are comparable in the comparator.

At least one embodiment of the invention is based on the idea of implementing a digital-analogue converter per pixel, having a coarse setting of a plurality of threshold values and a fine, more precise setting of the threshold values. The first voltage source has a plurality of tapping points or outputs. Each threshold value is settable in a coarse setting with K bits and, depending on the first voltage source, in a fine setting with L bits. The invention provides a digital-analogue converter for an X-ray detector with a plurality of threshold values per detector element, a "multi-threshold counter", wherein a partitioning of the K+L bits between the first voltage source and a second voltage source is provided. The first voltage source can be configured as a resistor chain, resistor ladder, R-ladder, potentiometer or resistance divider.

The variables N, K and L are natural non-zero numbers. The number of threshold values or energy channels N and the number of bits K are freely selectable. A preferred number of energy channels per pixel is N=4. The minimum number of tapping points, voltage levels or first voltage values can be stipulated by the number of 2K inputs of the switch matrices. The number of tapping points, voltage steps or first voltage values can be at least 2K+1. A preferred number of bits K is K≤8. A particularly preferred number of bits K is K=5. A preferred number of bits L lies in the range of 1 to 3. A particularly preferred number of bits L is L=2.

The switch matrices are connected to a plurality of tapping points. Each switch matrix can tap off the voltage at a portion of all the tapping points, for example, 50 percent of all the tapping points of the first voltage source. Exactly 2K inputs of a switch matrix are electrically conductively connected to exactly 2K tapping points of monotonically sequential first voltage values of the first voltage source. The switch unit comprises N switch matrices. The switch matrices are configured as a matrix of switches or multiplexers. The switch matrices select a tapping point at the first voltage source by way of the K bits. By way of K bits, a coarse setting of the threshold value can advantageously be achieved.

The second voltage source comprises N subunits. A subunit is associated with an energy channel, a comparator or a threshold. With L bits, a finer setting of the threshold can take place. The finer setting of the threshold value is carried out outside the first voltage source and thereby, the size and complexity of the first voltage source can advantageously be reduced.

A different energy span or a range of possible comparator voltages can be associated with the energy channels and comparators, or with first voltage values and second voltage values for comparison with the signal of the output of the pre-amplifier. Not every energy channel must be able to cover the whole possible energy range. Advantageously, the number of electrically conductive connections between the first voltage source and the switch unit is reduced.

The second voltage source can be configured in combination with a comparator. The comparator has a programmable input offset of the differential pair. 2L different second voltage values can be providable, for example, via resistors. In an alternative embodiment, 2L different second voltage values can be providable. Through injection of the bias current, the operating voltages can be altered, which leads to a variation of the input offset or a displacement of the reference voltage. Additional configuration bits can be present. These enable a partial bypass of the bias current of the comparator. Thus, the step width of the second voltage source and of the offset can be adapted. The size of the step widths of the second voltage source depends on a settable voltage (tune voltage). Advantageously, the threshold value and the step width of the second voltage source can be adapted or adjusted. Advantageously, the threshold values of a plurality of detector elements can be adapted to one another.

The step width of the second voltage source depends on the resistance or the resistances of the second voltage source and the bias current. The step width of the second voltage source can be adapted to the step width of the first voltage source. A subdivision of a step width of the first voltage source into equal-sized step widths of the second voltage source can advantageously be set so that, for example, in the case of L=2, the step width of the second voltage source is a quarter of the step width of the first voltage source. Advantageously, a fine setting can be achieved by way of the second voltage value for comparison with the signal of the output of the pre-amplifier. The signal of the output of the pre-amplifier can be represented by a voltage value.

The voltage values, first voltage value and second voltage value selected by the K+L bits serve for comparison of the signal of the output of the pre-amplifier in the comparator. A switch matrix and a second voltage source are associated with the comparator.

The energy thresholds are formed by the comparator. The comparator compares the output signal of the pre-amplifier with the selected first voltage value and the selected second voltage value. The energy thresholds can be configured by one-sided discriminators. If the signal exceeds the threshold, then the result is registered in this energy channel. The event can be registered in a plurality of energy channels. The highest energy threshold can be, for example, 90 keV. The lowest energy threshold can be, for example, 5 keV or 35 keV. Each energy threshold is individually settable by way of K+L bits. Advantageously, by way of the partitioning of the bits into first voltage source and second voltage source, the area necessary can be reduced. Advantageously, the number of energy channels or comparator voltages has only a slight influence on the area necessary and the power needed. Advantageously, the number of energy channels is scalable. Advantageously, the X-ray detector is configured to provide many energy channels.

The linearity of the digital-analogue converter is advantageously mainly only limited by the reproducibility of the resistors. Advantageously, the linearity of the digital-analogue converter is the same for all energy channels. The digital-analogue converter requires no additional buffer stage or active circuits. Advantageously, an increase in noise, in particular the 1/f noise can be prevented. Advantageously, the power, the area and the requirement criteria for the stability can be reduced. The digital-analogue converter requires no additional clock signals or other complex digital circuits. Advantageously, the crosstalk and increased noise can be prevented.

The ranges with achievable comparator voltages or first voltage values and second voltage values for each energy channel can at least partially overlap in that the tapping points of a plurality of switching matrices are selectable. Advantageously, the calibration is simplified by the at least partially overlapping region. The partitioning into first voltage source and second voltage source advantageously enables a large energy range for the energy channels, whereas only a comparatively small number of bits K+L is needed for setting the comparator voltage or the first voltage value and the second voltage value. Advantageously, the digital-analogue converter has a constant current usage which is independent of the number of energy channels used. The digital-analogue converter advantageously prevents current peaks or alternating voltage drops. Advantageously, the digital-analogue converter reduces the noise of the first voltage values and the second voltage values.

The comparison in the comparator can correspond, from a mathematical viewpoint, to the comparison in which the signal of the output of the pre-amplifier is greater than or equal to the sum of the first voltage value and the second voltage value.

At least one embodiment of the invention further relates to a medical device comprising at least one embodiment of an X-ray detector.

The advantages of the X-ray detector according to at least one embodiment of the invention can be transferred to the medical device.

The medical device of at least one embodiment includes a computed tomography device or a C-arm angiography system. With the space-saving, power-efficient and power-stable implementation, a plurality of energy channels can be realized, for example without loss of spatial resolution. Advantageously, by way of a weighted addition of the counting events in different energy channels, an improved contrast for monochromatic X-ray images can be achieved. Advantageously, materials within the examination object can be distinguished using a plurality of base materials.

In accordance with one embodiment of the X-ray detector, the signal of the output of the pre-amplifier is comparable in the comparator with the sum of the first voltage value and the second voltage value. The adjustment or comparison can be configured so that it is checked whether the signal of the output of the pre-amplifier is greater than or equal to the sum of the first voltage value and the second voltage value.

In accordance with one embodiment of the X-ray detector, the difference of the signal of the output of the pre-amplifier and the second voltage value is comparable in the comparator with the first voltage value. The adjustment or comparison can be configured so that it is checked whether the signal of the output of the pre-amplifier less the second voltage value is greater than or equal to the first voltage value.

In accordance with one embodiment of the X-ray detector, on changing the switching behavior of the comparator by the second voltage value, the signal of the output of the pre-amplifier and the first voltage value are comparable in the comparator. The switching behavior of the comparator can be changed by the second voltage value so that the comparator has a switching behavior changed or raised by the second voltage value. The adjustment or comparison can be configured so that it is checked whether the signal of the output of the pre-amplifier on changing the switching behavior is greater than or equal to the second voltage value. With the changed switching behavior, the comparator can carry out a comparison of the signal of the output of the pre-amplifier with the first voltage value such that the comparison corresponds, from a mathematical viewpoint, to the comparison in which the signal of the output of the pre-amplifier is greater than or equal to the sum of the first voltage value and the second voltage value.

In accordance with one embodiment of the X-ray detector, the second voltage source is included by the discriminator unit. The subunit of the second voltage source can be included by the comparator. Advantageously, the comparator and the subunit of the second voltage source form one constituent or one component. The digital-analogue converter can be partially, for example, the subunit of the second voltage source, included by the comparator. Advantageously, the comparison can be carried out without steps of the subtraction or addition within a component. Advantageously, the steps or their implementation for addition or subtraction of combinations of the signal of the output of the pre-amplifier, the first voltage value and the second voltage value can be avoided. Advantageously, the number of components used in the implementation can be reduced. Advantageously, a space-saving and a reduction of the length of the signal lines can be achieved.

In accordance with one embodiment of the X-ray detector, the first voltage source comprises a resistor chain with a plurality of equal-valued, serially arranged resistors wherein the tapping points are providable before or after a resistor or between adjacent resistors.

The equal-valued resistors have the same resistance value, wherein a tolerance of +10% to −10% is allowed. The voltage difference or step width between the tapping points is, for example, approximately 10 mV. The step width between the tapping points can advantageously be constant due to the equal-valued resistors. The first voltage source can have (2K+1−1) resistors. In a preferred embodiment, the first voltage source has 63 resistors. The entire energy range coverable with the first voltage source can be selected 25% larger than the desired or necessary energy range, in order advantageously to be able to compensate for production variations. The input voltage VDAC, the overall resistance of the resistor ladder and the resistance value of the individual resistors determine the output voltage at the tapping points and the step width between the tapping points of the first voltage source.

In accordance with one embodiment of the X-ray detector, the first voltage source is connected to a settable input voltage VDAC.

With the input voltage VDAC, the step width or voltage difference between the tapping points can be compressed or stretched. Advantageously, the step width is settable. The first voltage source is connected to earth at the opposite end of the resistance chain. Advantageously, production variations can be equalized by way of the settability of the input voltage VDAC.

An internal voltage source can be used for the input voltage VDAC. The internal voltage source can be programmable and a reduction of the supply voltage can be settable. An external voltage source can be used for the input voltage VDAC, wherein the input voltage can be set by the external voltage source. By changing the input voltage VDAC, the step width of the second voltage source can also be adapted.

In accordance with one embodiment of the X-ray detector, the first voltage source has 2K+1 tapping points. With K bits, a tapping point can be selected from 2K tapping points. Advantageously, twice as many tapping points are available. Advantageously, a different coherent region can be associated with each switch matrix. Advantageously, the electrically conductive connections per tapping point are reduced.

In accordance with one embodiment of the X-ray detector, a plurality of tapping points is electrically conductively connected to the inputs of a plurality of switch matrices.

The number of tapping points associated with one switch matrix can vary. The electrically conductive connections between a switch matrix and the associated tapping points is independent of other switch matrices. Advantageously, the first voltage source can be configured in a space-saving manner. Advantageously, the electrically conductive connections can be arranged distributed or equalized.

In accordance with one embodiment of the X-ray detector, the switch matrices are configured as multiplexers. Advantageously, the tapping point can be selected efficiently with few processing steps and few components.

In accordance with one embodiment of the X-ray detector, the first voltage source has a zero point regulating circuit for setting a reference voltage or a zero point.

The zero point regulating circuit can be implemented once per pixel. The zero point regulating circuit can be implemented in the first voltage source. A tapping point can be determined as the zero point at approximately 10% of the total resistance of the resistor ladder. The tapping points can have first voltage values which enable an energy threshold of below 0 keV. The tapping point of the zero point can define or set the position of the zero point corresponding to 0 keV. Advantageously, "undershoots" where a signal, for example of an event, under 0 keV occurs, in the signal of the output of the pre-amplifier can be registered. Advantageously, the crosstalk at higher photon fluxes, so-called "pile-up" can be determined or investigated with the aid of the registered undershoots.

The zero point can influence the signal at the inputs of the comparators of a pixel via the zero point regulating circuit with the aid of a known and fixed value. The zero point regulating circuit can control the signal of the inputs of the comparators such that the rest signal, that is without the signal of an event or X-ray photon, has the set voltage, the reference voltage or the zero point. For signals at the inputs of the comparators with a significant or measurable component of pile-up, the zero point regulating circuit can influence the signal at the inputs of the comparators such that the mean voltage at the input of the comparators lies at the level of the zero point. For signals at the inputs of the comparators with a significant or measurable component of pile-up, the zero point regulating circuit can influence the signal at the inputs of the comparators such that signals or voltage values below the zero point do not, or only seldom, occur. Thus, the zero point regulating circuit defines the position of the signal of an X-ray photon or a rest signal at the input of the comparators. The zero point regulating circuit can be identified as a baseline holder.

In the case of a direct connection of the output of the pre-amplifier to the inputs of the comparators, the signal at the inputs of the comparators can be identical to the output signal of the pre-amplifier. A similar principle can apply for the output of the following stages if further signal forming stages, so-called "shapers", follow on from the pre-amplifier. The zero point regulating circuit can influence the input signal of the comparators in that it influences the signal of the output of the pre-amplifier and/or the stages following it. In the case of a capacitive connection of the output of the pre-amplifier to the inputs of the comparators, the position of the signal at the inputs of the comparators can be independent of the position of the signal of the output of the pre-amplifier and the zero point regulating circuit can directly influence the signal behind the capacitor on the side of the comparators.

In a direct connection of the output of the pre-amplifier to the inputs of the comparators, the zero point regulating circuit can directly influence the position of the signal of the output of the pre-amplifier, for example, by way of the strength of a compensation current at the input of the pre-amplifier. The zero point regulating circuit can draw just as much DC current from the input node of the pre-amplifier so that the output voltage of the pre-amplifier, for example, a transimpedance amplifier, lies exactly at the desired reference voltage or the zero point. Advantageously, the zero point can be selected at a tapping point of the first current source.

A reference of 0 keV can be selected as the zero point. The other tapping points can advantageously relate to other energies by way of a conversion factor or amplification factor of the pre-amplifier. The sum of the first voltage value and the second voltage value corresponds to the energy threshold of the individual energy channels. The energy threshold relates to 0 keV. The zero point can advantageously be set for all pixels independently. Advantageously, readjustment of the comparator voltages or the first voltage value and the second voltage value are avoided on displacement of the zero point, since the energy threshold relates to the zero point. The zero point regulating circuit can ensure that the signal of the output of the pre-amplifier takes account of or contains the zero point.

In accordance with one embodiment of the X-ray detector, the zero point regulating circuit comprises a first binary weighted resistance before the resistor chain and a second binary weighted resistance after the resistor chain.

The voltage associated with the zero point can be set by binary weighted resistances. The binary weighted resistances can be short-circuited via switches which are controllable by B bits. By changing the first binary weighted resistor at the start of the second binary weighted resistor at the end of the resistor ladder, the voltage values of all the tapping points and of the zero point can advantageously be displaced. A common displacement of the first voltage values of all the tapping points can advantageously be achieved by changing the first binary weighted resistor and the second binary weighted resistor.

The change of the first binary weighed resistor and of the second binary weighted resistor can take place in the opposite direction to a resistance change by the same amount. The position of the signal of the output of the pre-amplifier or the rest signal can be displaced to higher or lower voltages. For example, the position of the signal of the output of the pre-amplifier can be displaced such that neither the upper nor the lower limit of the dynamic range is reached. Advantageously, influences by the upper or lower limit of the dynamic range and their limitation are reduced with regard to linearity. The other tapping points can advantageously be related to the zero point. The position of the zero point can be displaced so that the energy thresholds are advantageously retained and do not have to be determined anew. Advantageously, the zero point can be displaced without the energy of the zero point being changed. The displacement of the position of the zero point can be achieved by the displacement of the first voltage values at all tapping points. The position of the zero point can advantageously be controllable or settable by the displacement of the first voltage values. At the same time, the necessary current advantageously remains constant since the whole resistance of the resistance chain does not change.

In accordance with one embodiment of the X-ray detector, the zero point regulating circuit is controllable by way of B bits. Advantageously, the voltage values of all the tapping points and of the zero point can be displaced. Preferably, B=4. The tapping point of the zero point can be fixed or unchangeable. Advantageously, the position of the signal of the output of the pre-amplifier can be displaced to higher or lower voltages by setting the B bits. Advantageously, the calibration of the energy thresholds is retained.

In accordance with one embodiment of the X-ray detector, the second voltage source is settable. The input offset, the second voltage value, the operating voltage and/or the partial bypass of the bias current of the comparator are settable. Advantageously, the step width of the second voltage source, the offset of the voltage source and the energy threshold can be set. The different second voltage values of the second voltage source can be displaced, stretched or compressed. Furthermore, the step width can be set. Differences between energy channels or detector elements can advantageously be compensated for.

In accordance with one embodiment of the X-ray detector, the second voltage source L provides varying or different second voltage values, wherein the L different second voltage values make a whole number multiple of a ½L-share of the difference between adjacent tapping points of the first voltage source.

Advantageously, the energy threshold can be set at the adjacent tapping point with a coarse setting by way of a first voltage value of the first voltage source selected by the switch matrix and with a fine setting via intermediate stages to a further first voltage value following the selected first voltage value.

In accordance with one embodiment of the X-ray detector, the comparators are configured as comparators with hysteresis. By way of the hysteresis, multiple countings of an event are advantageously prevented.

In accordance with one embodiment of the X-ray detector, the hysteresis is activatable or deactivatable by way of an additional bit. Advantageously, the use of the hysteresis can be adapted to the case of use.

FIG. 1 shows an example embodiment of a concept of an X-ray detector 1 according to an embodiment of the invention in accordance with a first embodiment. The X-ray detector 1 has, for example, one detector element 3. The detector element 3 has a first voltage source 5, a switch element 71, a second voltage source 81 and a discriminator unit 91. The first voltage source 5 has an input voltage VDAC 13. The first voltage source 5 also has a plurality of tapping points 7. The first voltage source 5 makes available a plurality of first voltage values at tapping points 7. The first voltage values are provided equidistantly and in a monotonic sequence. The first voltage source has at least 2K+1 tapping points 7. The switch unit 71 comprises N switch matrices 73. The inputs 75 of the switch matrices 73 are electrically conductively connected to tapping points 7 of monotonically sequential first voltage values of the first voltage source 5. A plurality of tapping points 7 is electrically conductively connected to the inputs 75 of a plurality of switch matrices 73. A tapping point 7 of the first voltage source 5 is selectable from the switch matrices 73 with K bits. The switch matrices 73 have a selected first voltage value at an output 77.

The second voltage source 81 comprises N subunits 83. The inputs 85 of the subunits 83 are conductively connected to associated outputs 77 of the switch matrices 73, so that the subunits 83 have the selected first voltage value of an associated switch matrix 73 at an input 85. A second voltage value is selected from one of 2L varying or different second voltage values (not shown) of the subunits 83 with L bits. The 2L varying or different second voltage values are provided within the subunits 83. The selected first voltage value and the selected second voltage value are added in an adding unit (not shown) within the second voltage source 81. The sum of the first voltage value and the second voltage value is provided at the output 87 of the subunits 83.

The discriminator unit 91 comprises N comparators 93. The inputs 95 of the comparators 93 are electrically conductively connected to associated outputs 87 of the second voltage source 81. An associated sum of the first voltage value and the second voltage value as a comparator voltage or an energy threshold is associated with each comparator 93. An output signal is provided at the output 96 of the comparator 93. The output 97 of the pre-amplifier is connected to the discriminator unit 91. The signal of the output 97 of the pre-amplifier is available to the comparators 93 for comparison. The comparison is configured so that it is checked whether the signal of the output 97 of the pre-amplifier is greater than or equal to the sum of the first voltage value and the second voltage value. If the signal of the output 97 of the pre-amplifier exceeds the energy threshold, then an output signal is provided which is fed to a register (not shown). The digital-analogue converter 15 is controlled with K+L bits. K bits are fed to the switch matrices 73, the switch matrices 73 select a tapping point 7 according to the information contained in the K bits and thus select a first voltage value. L bits are fed to the subunits 83 of the second voltage source 81, the subunits 83 select a second voltage value according to the information contained in the L bits.

Figure 2:
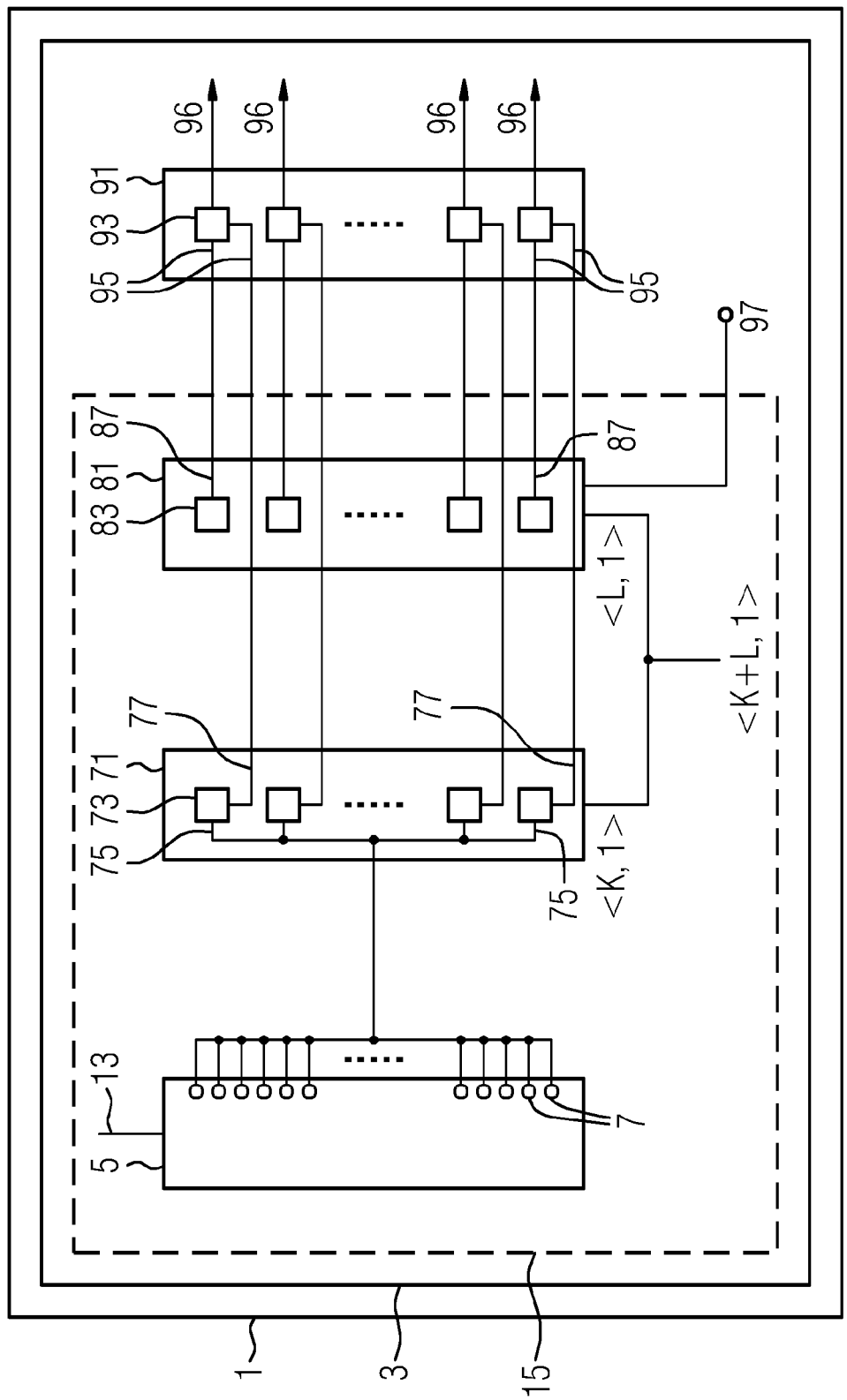
FIG. 2 is a schematic representation of a concept of an X-ray detector according to the invention in accordance with a second embodiment.

FIG. 2 shows an example embodiment of a concept of an X-ray detector 1 according to the invention in accordance with a second embodiment. The output 77 of the switch matrix 73 has the first voltage value. The output 77 of the switch matrix 73 is electrically conductively connected to an input 95 of the comparator 93. The second voltage source 81 has a voltage value at the output 87 corresponding to the signal of the output 97 of the pre-amplifier as a voltage value less the second voltage value. The output 87 of the second voltage source 81 is electrically conductively connected to an input 95 of the comparator 93. In the comparator 93, the voltage value according to the signal of the output 97 of the pre-amplifier as a voltage value less the second voltage value is compared with the first voltage value. The comparison is configured so that it is checked whether the signal of the output of the pre-amplifier less the second voltage value is greater than or equal to the first voltage value.

Figure 3:
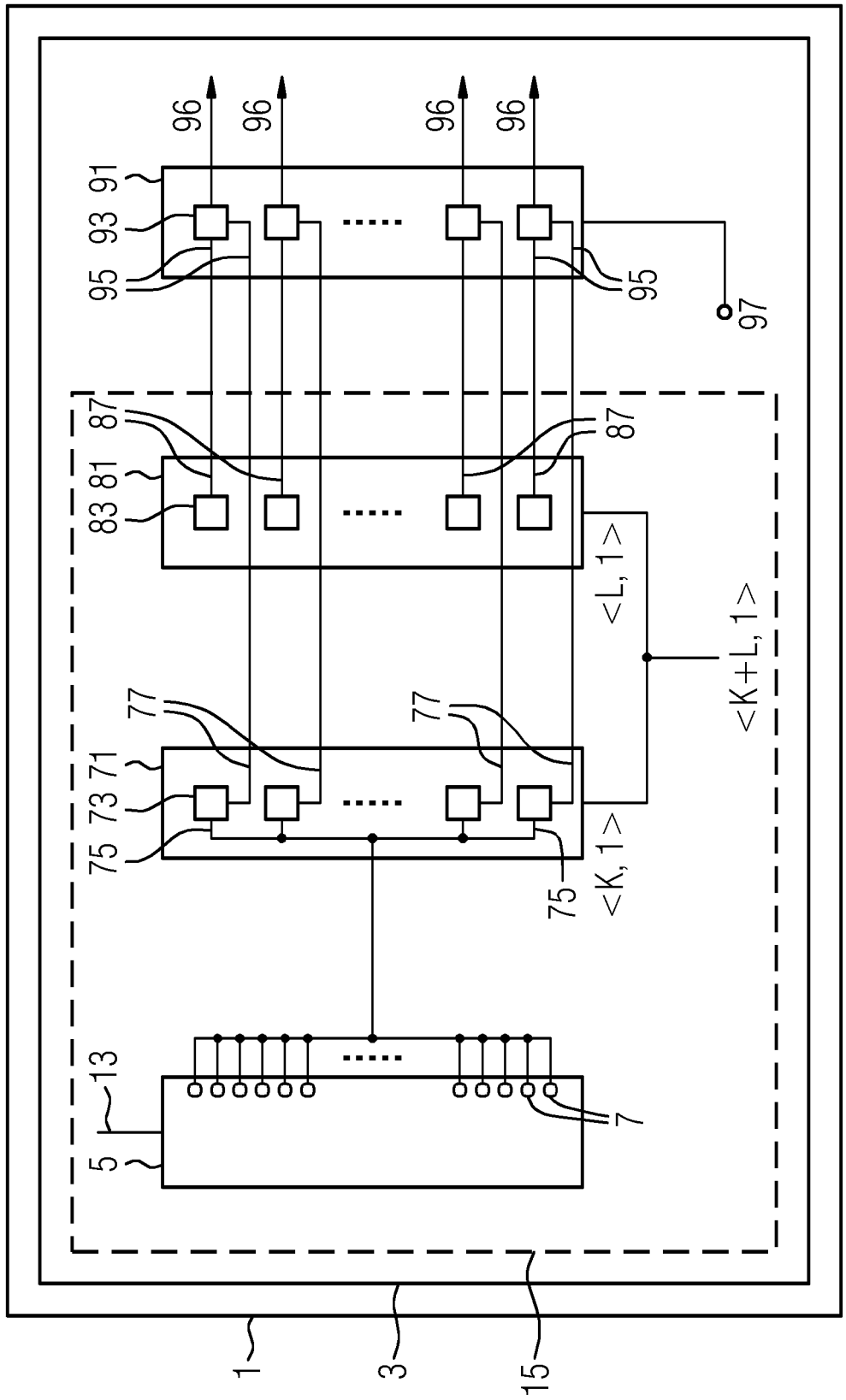
FIG. 3 is a schematic representation of a concept of an X-ray detector according to the invention in accordance with a third embodiment.

FIG. 3 shows an example embodiment of a concept for an X-ray detector 1 according to the invention in accordance with a third embodiment. The output 77 of the switch matrix 73 has the first voltage value. The output 77 of the switch matrix 73 is electrically conductively connected to an input 95 of the comparator 93. The second voltage source 81 has the second voltage value at the output 87. The output 87 of the second voltage source 81 is electrically conductively connected to an input 95 of the comparator 93, so that the switching behavior of the comparator 93 is changed by the second voltage value. The output 97 of the pre-amplifier is connected to the discriminator unit 91. The signal of the output 97 of the pre-amplifier is available to the comparators 93 for comparison. The adjustment or comparison is configured so that it is checked whether the signal of the output 97 of the pre-amplifier on changing the switching behavior is greater than or equal to the second voltage value. With the changed switching behaviors, the comparator 93 can carry out a comparison of the signal of the output 97 of the pre-amplifier with the first voltage value such that the comparison corresponds, from a mathematical viewpoint, to the comparison in which the signal of the output 97 of the pre-amplifier is greater than or equal to the sum of the first voltage value and the second voltage value.

Figure 4:
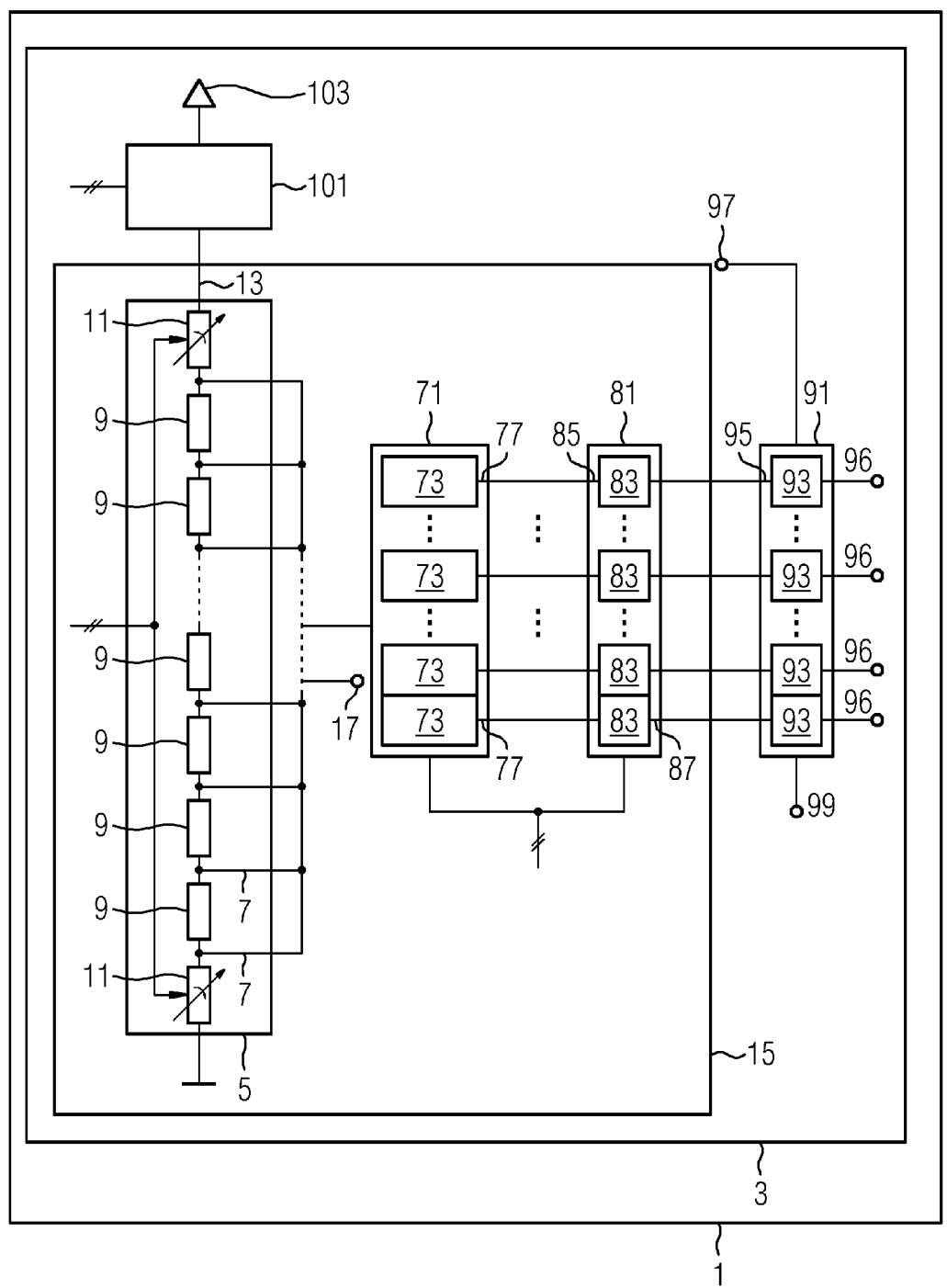
FIG. 4 is a schematic representation of a concept of an X-ray detector according to the invention in accordance with a fourth embodiment.

FIG. 4 shows an example embodiment of a concept for an X-ray detector 1 according to the invention in accordance with a fourth embodiment. The fourth embodiment shows an actual configuration in accordance with the first embodiment type. The internal voltage source 101 is programmable and a reduction from the supply voltage 103 can be set. By changing the input voltage VDAC 13, the step width of the second voltage source 81 can also be adapted. The first voltage source 5 has a plurality of equal-valued resistors 9. The resistors 9 are configured as a resistor chain. The resistor chain with a plurality of equal-valued, serially arranged resistors 9 provides the tapping points 7 before or after a resistor 9 or between adjacent resistors 9. The switch matrices 73 are configured as multiplexers. The second voltage source 81 provides L different voltage values, wherein the L different voltage values make a whole number multiple of a ½L-share of the difference between the first voltage values of the adjacent tapping points 7 of the first voltage source 5. The comparators 93 of the discriminator unit 91 are configured as comparators 93 with hysteresis 99. The hysteresis 99 is activatable or deactivatable by way of an additional bit. The comparator 93 is electrically conductively connected to the output of the pre-amplifier 97. The signal of the output of the pre-amplifier 97 is compared in the comparator with the first voltage value and the second voltage value. The first voltage source 5 has a zero point regulating circuit for setting a reference voltage as the zero point 17. The zero point regulating circuit comprises a first binary weighted resistance 11 before the resistor chain and a second binary weighted resistance 11 after the resistor chain. The zero point regulating circuit is controllable by way of B bits. The comparator voltages or the energy thresholds are related to the zero point 17.

Figure 5:
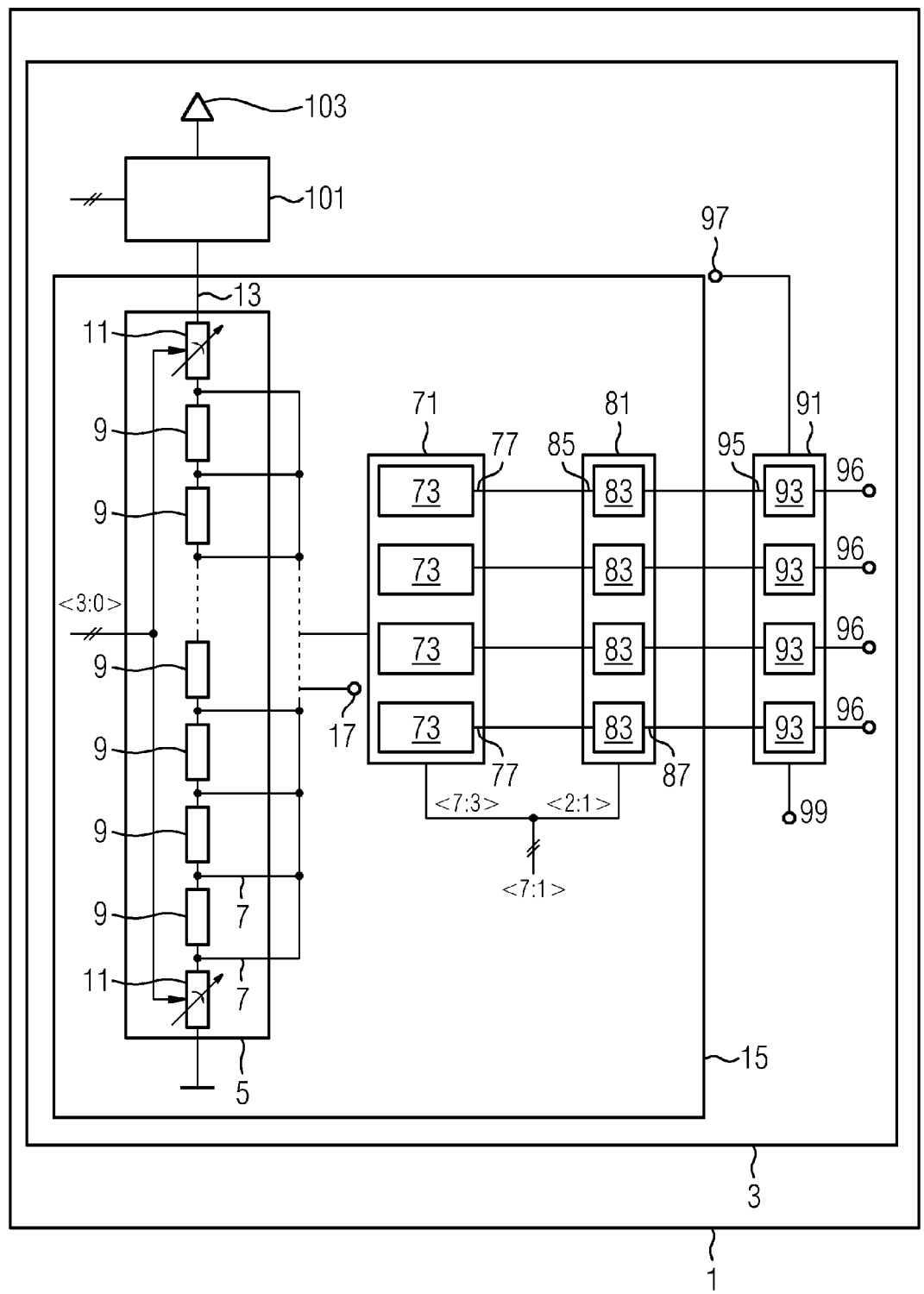
FIG. 5 is a schematic representation of a concept of an X-ray detector according to the invention in accordance with a fifth embodiment.

FIG. 5 shows an example embodiment of a concept of an X-ray detector 1 according to the invention in accordance with a fifth embodiment. In a preferred embodiment of the fourth embodiment, N=4, K=5, L=2 and B=4. The first voltage source 5 has 2K+1 or 64 tapping points 7. The first voltage source 5 has 2K+1−1 or 63 resistors 9.

Figure 6:
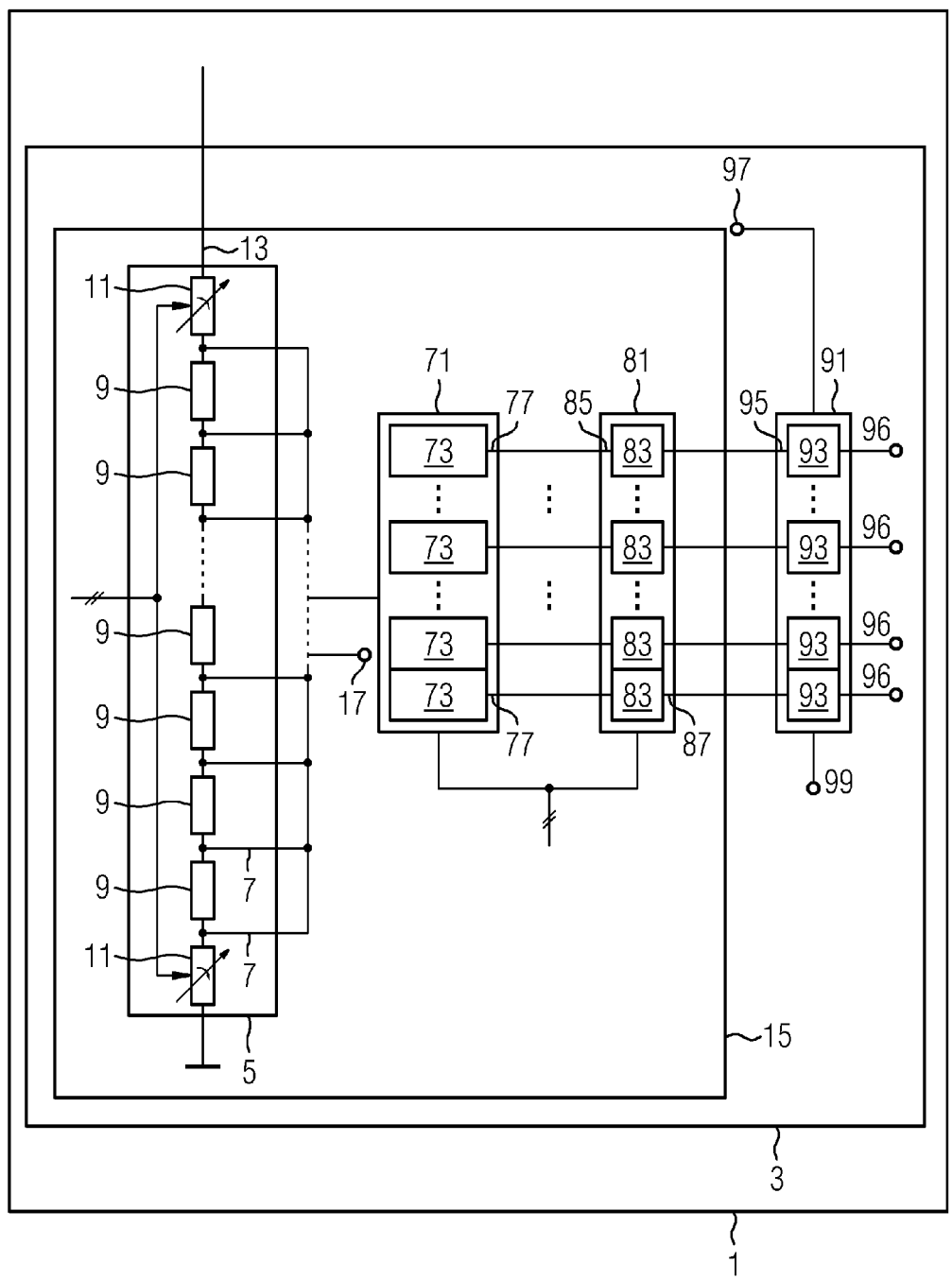
FIG. 6 is a schematic representation of a concept of an X-ray detector according to the invention in accordance with a sixth embodiment.

FIG. 6 shows an example embodiment of a concept of an X-ray detector 1 according to the invention in accordance with a sixth embodiment. In place of a programmable internal voltage source 101, an external voltage source (not shown) is provided. The external voltage source has the input voltage VDAC 13 which is specified by the external voltage source.

Figure 7:
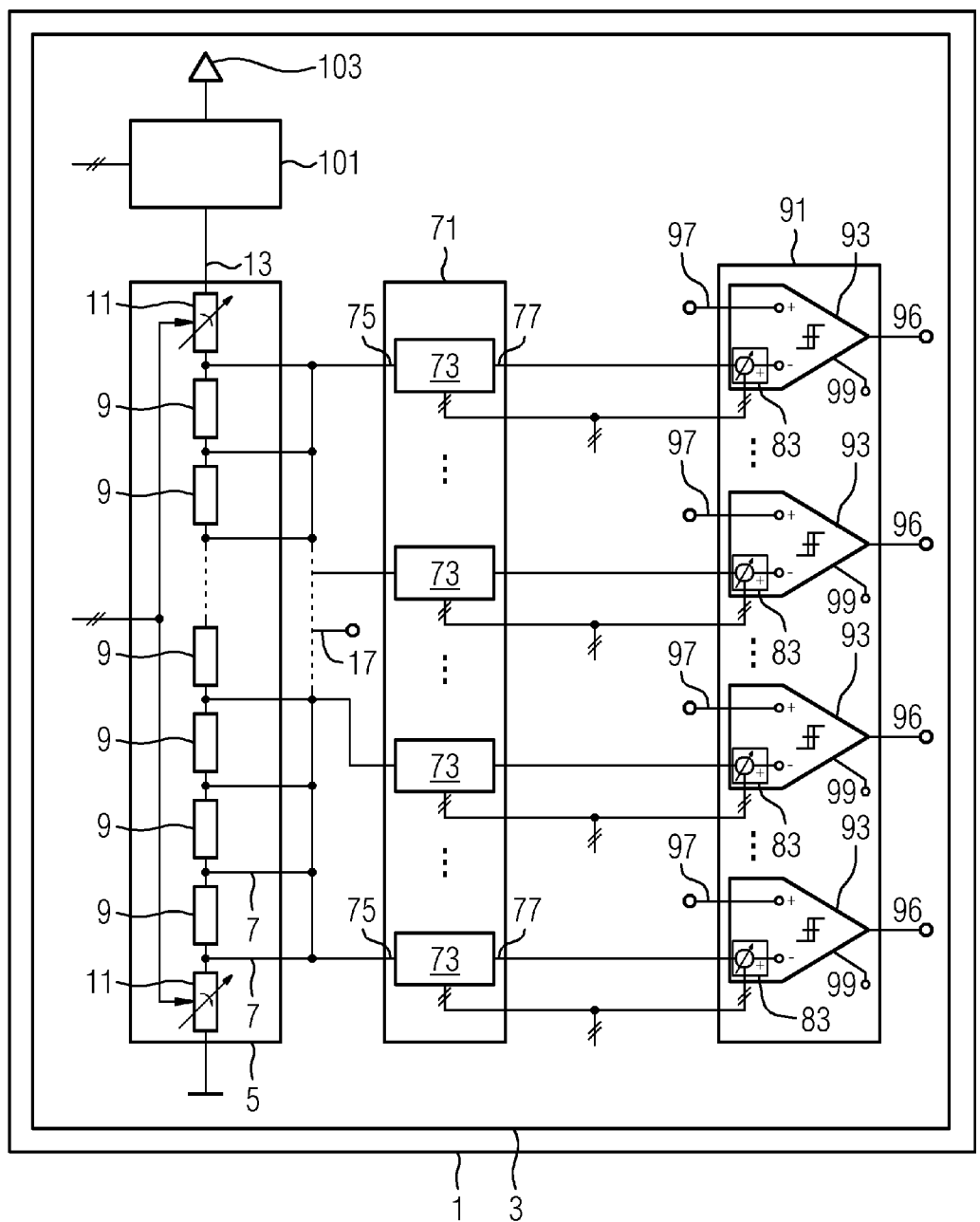
FIG. 7 is a schematic representation of a concept of an X-ray detector according to the invention in accordance with a seventh embodiment.

FIG. 7 shows an example embodiment of a concept of an X-ray detector 1 according to the invention in accordance with a seventh embodiment. The seventh embodiment shows an actual configuration in accordance with the third embodiment. In a preferred embodiment, the subunits 83 of the second voltage source 81 are encompassed by the discriminator unit 91. The associated subunit 83 is encompassed by the comparator 93.

Figure 8:
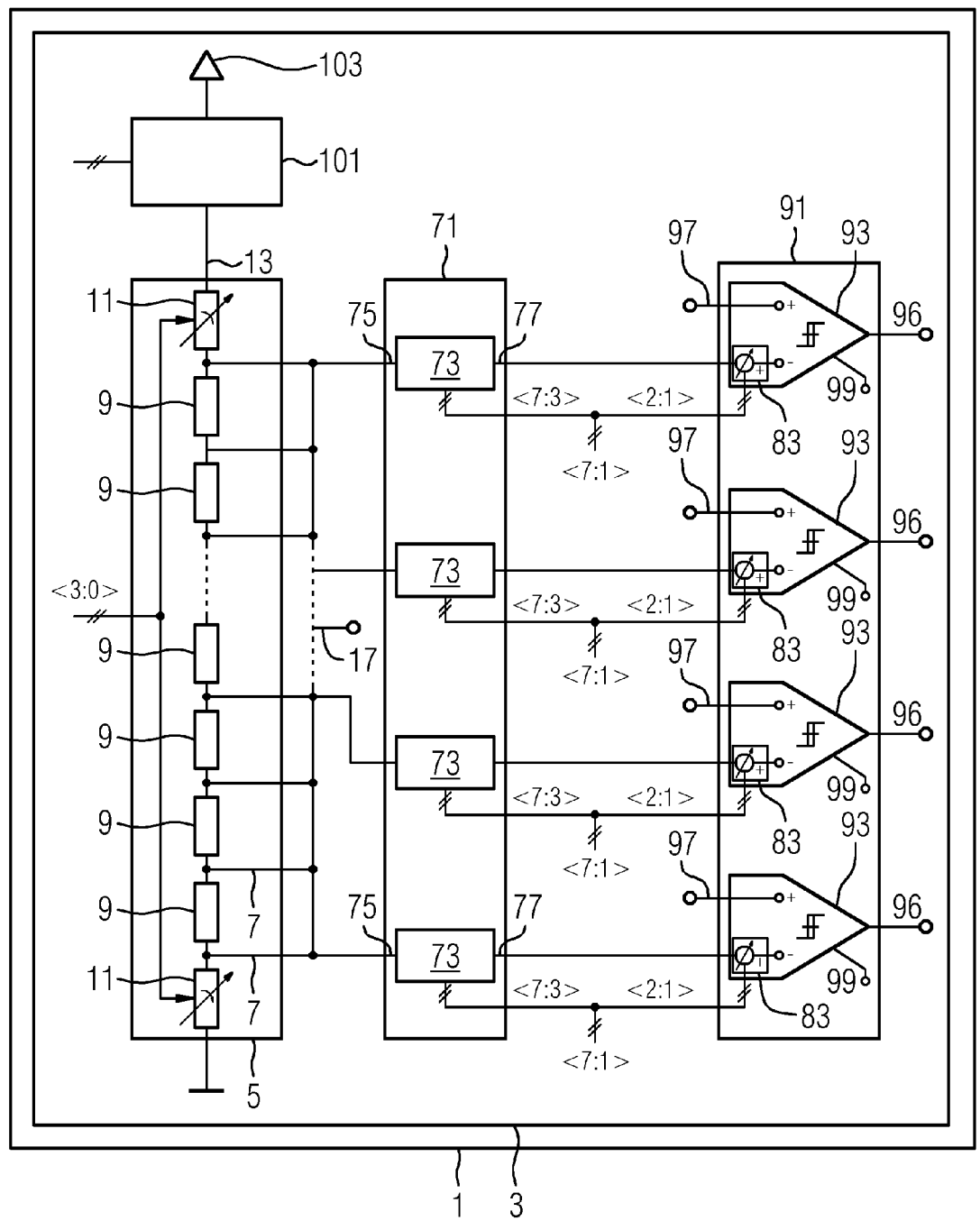
FIG. 8 is a schematic representation of a concept of an X-ray detector according to the invention in accordance with a eighth embodiment.

FIG. 8 shows an example embodiment of a concept of an X-ray detector 1 according to the invention in accordance with an eighth embodiment. In a preferred embodiment of the seventh embodiment, N=4, K=5, L=2 and B=4. The first voltage source 5 has 2K+1 or 64 tapping points 7. The first voltage source 5 has 2K+1−1 or 63 resistors 9.

Figure 9:
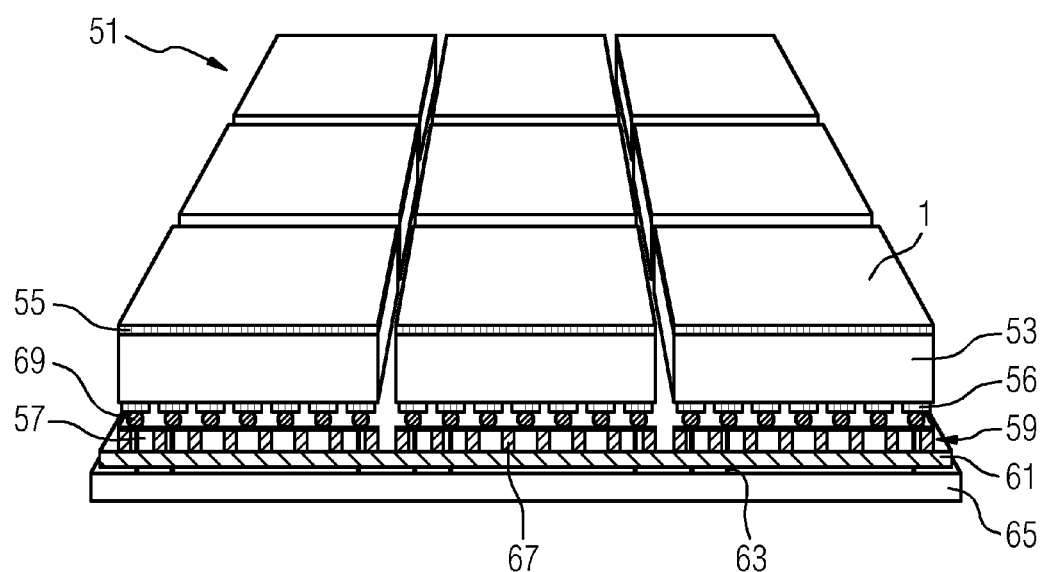
FIG. 9 is a schematic representation of a detector module with an arrangement of X-ray detectors according to an embodiment of the invention.

FIG. 9 shows an example embodiment of a detector module 51 with an arrangement of X-ray detectors 1 according to the invention. In a preferred embodiment, the X-ray detector 1 has a two-dimensional matrix or arrangement of a plurality of pixels or subpixels. The number of subpixels can be, for example, in the range from 100 to several thousand. The subpixel or the pixel has the digital-analogue converter according to the invention and the discriminator unit according to the invention. The subpixels thus have a plurality of energy channels. The X-ray detector 1 has a sensor 53. The sensor 53 can be configured as an areal direct converter, for example, comprising CdTe, CZT, CdZnTeSe, CdTeSe, CdMnTe, InP, TlBr$_2$, HgI$_2$, GaAs or others as the converter material. The upper side of the sensor 53 has a top electrode 55. The underside of the sensor 53 has a two-dimensional arrangement of contacts 56. The contacts 56 are connected via solder connections 69 to the pixel electrodes 57 and the pixel electronics 67 in the ASIC 59. The solder connections 69 can be configured, for example, as solder balls (bump bonds) or solder material in connection with copper pillars. The number of contacts 56, the number of solder connections 69, the number of pixel electrodes 57 and the number of the pixel electronic units 67 in the ASIC 59 are the same. The electric field between the top electrode 55 and a contact 56 determines a sensitive detection volume. The unit of a detection volume, a contact 56, a solder connection 69, a pixel electrode 57 and a pixel electronic unit 67 connected to the pixel electrode 57 forms a pixel or subpixel. The ASIC 59 is connected on the underside to a substrate 61. The ASIC 59 is connected via TSV connections 63 through the substrate 61 to a peripheral electronic unit 65.

FIG. 10 shows an example embodiment of a computed tomography device 31 according to the invention with a detector apparatus 29 according to the invention. The detector apparatus 29 has the X-ray detector 1 according to the invention. The detector apparatus 29 can comprise a plurality of detector modules 51 which have at least one X-ray detector 1. Preferably, the detector modules 51 have a plurality of X-ray detectors 1 in a two-dimensional matrix or arrangement. The computed tomography device 31 comprises a gantry 33 with a rotor 35. The rotor 35 comprises an X-ray source 37 and the detector apparatus 29 according to the invention. The patient 39 is positioned on the patient support 41 and is movable along the rotation axis z 43 through the gantry 33. For control and to calculate the sectional images, a computer unit 45 is used. An input device 47 and an output apparatus 49 are connected to the computer unit 45.

Although the invention has been disclosed in detail with the example embodiments, the invention is not restricted by the examples given and other variations can be derived therefrom by a person skilled in the art without departing from the protective scope of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An X-ray detector comprising:
an N-channel digital-analogue converter controllable with K+L bits, including
  a first voltage source to provide a plurality of first voltage values at tapping points, the first voltage values being equidistant and providable in a monotonic sequence;
  a switch unit with N switch matrices, wherein $2^K$ inputs of the N switch matrices are electrically conductively connected to $2^K$ tapping points of monotonically sequential first voltage values of the first voltage source, a tapping point of the first voltage source of the N switch matrices being selectable with K bits, wherein the N switch matrices have a selected first voltage value at an output;
  a second voltage source including N subunits, wherein a second voltage value is selectable with L bits; and
  a discriminator unit including N comparators, at least one input of the N comparators being electrically conductively connected to an associated output of at least one of the N switch matrices and the associated output of the subunit, so that the associated first voltage value and the associated second voltage value are associable with each comparator, a signal of an output of a pre-amplifier, the associated first voltage value and the associated second voltage value being comparable in the comparator.

2. The X-ray detector of claim 1, wherein the signal of the output of the pre-amplifier is comparable in the comparator with the sum of the first voltage value and the second voltage value.

3. The X-ray detector of claim 1, wherein the difference between the signal of the output of the pre-amplifier and the second voltage value is comparable in the comparator with the first voltage value.

4. The X-ray detector of claim 1, wherein on changing the switching behavior of the comparator by the second voltage value, the signal of the output of the pre-amplifier and the first voltage value are comparable in the comparator.

5. The X-ray detector of claim 1, wherein the second voltage source is included by the discriminator unit.

6. The X-ray detector of claim 1, wherein the first voltage source comprises a resistor chain with a plurality of equal-valued, serially arranged resistors, and wherein the tapping points are providable before or after a resistor or between adjacent resistors.

7. The X-ray detector of claim 1, wherein the first voltage source is connected to a settable input voltage VDAC.

8. The X-ray detector of claim 1, wherein a plurality of tapping points is electrically conductively connected to the inputs of a plurality of switch matrices.

9. The X-ray detector of claim 1, wherein the switch matrices are configured as multiplexers.

10. The X-ray detector of claim 6, wherein the first voltage source has a zero point regulating circuit for setting a zero point.

11. The X-ray detector of claim 10, wherein the zero point regulating circuit comprises a first binary weighted resistance before the resistor chain and a second binary weighted resistance after the resistor chain.

12. The X-ray detector of claim 1, wherein the second voltage source is settable.

13. The X-ray detector of claim 1, wherein the second voltage source provides L different second voltage values, wherein the L different second voltage values make a whole number multiple of a $\frac{1}{2}^L$-share of the difference between adjacent tapping points of the first voltage source.

14. The X-ray detector of claim 1, wherein the comparators are configured as comparators with hysteresis.

15. The X-ray detector of claim 14, wherein the hysteresis is activatable or deactivatable by way of an additional bit.

16. A medical device comprising:
the X-ray detector of claim 1.

17. The X-ray detector of claim 1, wherein the first voltage source has a zero point regulating circuit for setting a zero point.

18. The X-ray detector of claim 17, wherein the zero point regulating circuit comprises a first binary weighted resistance before the resistor chain and a second binary weighted resistance after the resistor chain.

19. A medical device comprising:
the X-ray detector of claim 2.

20. A medical device comprising:
the X-ray detector of claim 3.

21. A medical device comprising:
the X-ray detector of claim 4.

* * * * *